United States Patent
Hsieh et al.

(10) Patent No.: US 10,859,906 B2
(45) Date of Patent: Dec. 8, 2020

(54) EXTREME ULTRAVIOLET ALIGNMENT MARKS

(71) Applicant: TAIWAN SEMICONDUCTOR MANUFACTURING COMPANY LIMITED, Hsin-Chu (TW)

(72) Inventors: Yi-Fu Hsieh, Taipei (TW); Chih-Chiang Tu, Tauyen (TW); Jong-Yuh Chang, Jhubei (TW); Hsin-Chang Lee, Zhubei (TW)

(73) Assignee: TAIWAN SEMICONDUCTOR MANUFACTURING COMPANY LIMITED, Hsin-chu (TW)

( * ) Notice: Subject to any disclaimer, the term of this patent is extended or adjusted under 35 U.S.C. 154(b) by 0 days.

(21) Appl. No.: 16/504,809

(22) Filed: Jul. 8, 2019

(65) Prior Publication Data

US 2019/0332004 A1 Oct. 31, 2019

Related U.S. Application Data

(62) Division of application No. 15/475,903, filed on Mar. 31, 2017, now Pat. No. 10,345,695.

(60) Provisional application No. 62/428,257, filed on Nov. 30, 2016.

(51) Int. Cl.
| | | |
|---|---|---|
| *G03F 1/42* | (2012.01) | |
| *G03F 1/84* | (2012.01) | |
| *G03F 1/24* | (2012.01) | |
| *G03F 1/48* | (2012.01) | |
| *G03F 1/54* | (2012.01) | |
| *G03F 1/78* | (2012.01) | |
| *G03F 1/80* | (2012.01) | |
| *G03F 1/82* | (2012.01) | |

(52) U.S. Cl.
CPC .................. *G03F 1/42* (2013.01); *G03F 1/24* (2013.01); *G03F 1/48* (2013.01); *G03F 1/54* (2013.01); *G03F 1/78* (2013.01); *G03F 1/80* (2013.01); *G03F 1/82* (2013.01); *G03F 1/84* (2013.01)

(58) Field of Classification Search
CPC ..... G03F 1/24; G03F 1/42; G03F 1/48; G03F 1/54; G03F 1/78; G03F 1/80; G03F 1/82; G03F 1/84
USPC ............................................................ 430/5
See application file for complete search history.

(56) References Cited

U.S. PATENT DOCUMENTS

| | | |
|---|---|---|
| 8,216,744 B2 | 7/2012 | Itoh |
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 4/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |

*Primary Examiner* — Christopher G Young

(74) *Attorney, Agent, or Firm* — Cooper Legal Group, LLC

(57) ABSTRACT

The present disclosure describes a method to form alignment marks on or in the top layer of an extreme ultraviolet (EUV) mask blank without the use of photolithographic methods. For example, the method can include forming a metal structure on the top layer of the EUV mask blank by dispensing a hexacarbonylchromium vapor on the top layer of the EUV mask and exposing the hexacarbonylchromium vapor to an electron-beam. The hexacarbonylchromium vapor is decomposed to form the metal structure at an area which is proximate to where the hexacarbonylchromium vapors interact with the electron-beam. In another example, the method can include forming a patterned structure in the top layer of an EUV mask blank with the use of an etcher aperture and an etching process.

20 Claims, 9 Drawing Sheets

EXTREME ULTRAVIOLET ALIGNMENT MARKS

RELATED APPLICATIONS

This application is a divisional of and claims priority to U.S. Non-Provisional patent application Ser. No. 15/475,903, titled "EXTREME ULTRAVIOLET ALIGNMENT MARKS" and filed on Mar. 31, 2017, which claims priority to U.S. Provisional Patent Application 62/428,257, titled "EUV ALIGNMENT MARK FORMATION METHOD" and filed on Nov. 30, 2016. U.S. Non-Provisional patent application Ser. No. 15/475,903 and U.S. Provisional Patent Application 62/428,257 are incorporated herein by reference.

BACKGROUND

Photomask blanks (mask blanks) are the base material of reticles and masks that are used as the patterning templates of circuits during the semiconductor lithography process. Defects present on mask blanks increase pattern defectivity on wafers during subsequent photolithography steps. Therefore, defect reduction during mask making is important for yield and throughput improvement.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
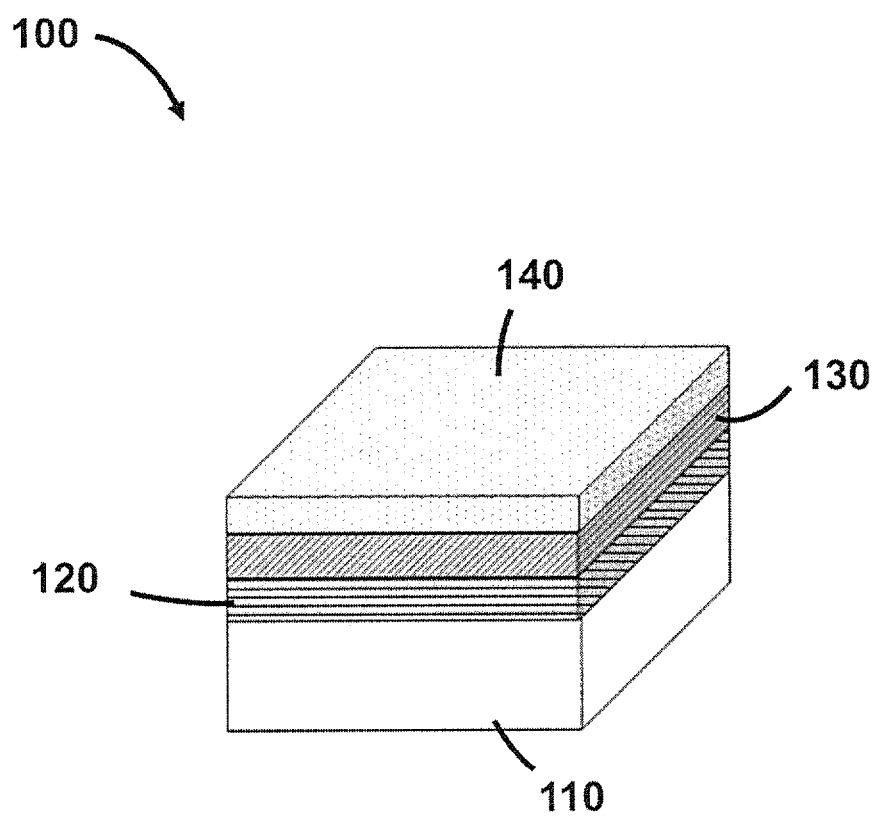
FIG. 1 is an isometric view of an extreme ultraviolet (EUV) mask blank, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "vertical," as used herein, means nominally perpendicular to the surface of a substrate.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the current disclosure.

A reticle and a photomask each contain a pattern image to be reproduced in a photoresist (resist) coating on a wafer. A resist is a compound that undergoes a change in solubility in a developer solution due to exposure to an ultraviolet (UV) or extreme ultraviolet (EUV) light. A resist can be a stack of one or more layers. A reticle contains the pattern image for a part of the wafer that is stepped and repeated across the entire wafer. The reticle's pattern image to be exposed is also called "a shot" and may contain a pattern of several dies. Reticles are used for step-and-repeat steppers and step-and-scan systems. In contrast, a photomask, or mask, contains the pattern image for a complete wafer die array and the pattern is transferred in a single exposure through a 1:1 image transfer. Some benefits of using reticles, as opposed to masks, are the ability to print patterns on the wafer in the submicron regime due to the larger pattern size on the reticle (e.g., 4:1 and 5:1) and the ability to adjust for individual die alignment and focus, which is advantageous when topography differences are present across the wafer due to a film or process non-uniformity.

The repetitive imaging process imposes stringent requirements on the reticles. For example, in a reticle that contains the images of a particular layer for four product dies in a shot, a single defect on the reticle is capable of causing product failure that reduces yield by 25%. Such a large yield loss from a single defect demands zero tolerance for defects on the reticle. Because reticle defects and variations can be reproduced repetitively on a wafer, reticle defectivity needs to be tightly controlled and constantly monitored through an inspection process, which occurs periodically with the purpose of examining the condition of the reticle before its re-use.

Reticles and masks are fabricated with techniques similar to those used in typical wafer photolithography processing. As an example, a reticle or mask fabrication process begins with a mask blank, which includes an opaque film (top layer), usually chromium or chromium-containing compounds, deposited on a low thermal expansion (LTE) material or quartz substrate. A coating of resist is applied on the mask blank. After the resist is exposed according to a circuit pattern, the exposed resist is then developed to expose portions of the opaque material. The exposed portions of the opaque material are then etched. Finally, the remaining resist is stripped leaving behind the circuit pattern which has been reproduced on the etched opaque material. Reticle patterning can be accomplished using electron-beam (e-beam) writers, which are tools that expose the resist on the mask blanks according to suitably formatted layouts of circuit designs. E-beam can provide high resolution patterns. But, e-beam has its disadvantages: speed and complexity.

Each reticle is aligned to the exposure tool's projection optics when the reticle is mounted on the reticle stage. Once aligned, the wafer stage with the wafer is then aligned to the reticle. During field-by-field alignment, the stepper steps to each shot location on the wafer, focuses, aligns, and then exposes the pattern within the shot on the wafer. The specific details of stepper alignment systems are unique to each manufacturer due to the requisite control to align the reticle and wafer pattern within, for example, a few nanometers.

Mask blank defects increase pattern defectivity on wafers during subsequent photolithography operations. Particularly, for EUV photolithography where the mask blanks are complex multilayer structures, mask blanks are inspected in detail for defects before the main pattern is reproduced. Alignment marks at predetermined locations on the mask blank act as reference coordinates to determine and register the defect location by the inspection tools. Once a defect is identified, its coordinates are registered (defect registration) using the alignment marks as reference points. When the mask blank proceeds to the main patterning step, the registered coordinates of the defect are used to shift the main pattern so that the defect is reproduced on a non-critical area of the main pattern such as, for example in a "dummy" area.

Alignment marks can be formed prior to the main pattern formation using similar fabrication methods to the pattern reproduction process on the mask blanks described above. For instance, a coating of resist is applied on the mask blank. The resist is exposed according to an alignment mark pattern at specific predetermined locations, and the exposed resist is then developed. This will expose portions of the top layer of the mask blank. The exposed portions of the top layer of the mask blank are then etched. The remaining resist is stripped with a wet clean process that dissolves the remaining developed resist and leaves behind an alignment mark pattern reproduced in the etched top layer of the mask blank. In other words, alignment mark formation requires a combination of additional photolithography and etch operations. Due to this subsequent photolithographic and etching process repetition, for the alignment mark formation and then for the main pattern transfer, there is a higher probability for defect generation due to the large number of processing steps involved. In addition, the process time increases, thus impacting manufacturing time and cost.

Various embodiments according to this disclosure provide processes which do not require a mask, resist application, exposure, or patterning of the resist to form alignment marks. As a result, fewer processing operations are required and fewer defect particles are generated during processing, thus reducing manufacturing time and cost.

FIG. 1 is an isometric view of an extreme ultraviolet (EUV) mask blank 100, according to some embodiments. EUV mask blank 100 includes an LTE substrate material 110, a reflective multilayer 120, an absorber layer 130, and a hard mask top layer 140. In some embodiments, LTE substrate 110 is a titanium oxide ($TiO_2$) doped silicon oxide ($SiO_2$) amorphous glass with a chromium nitride (CrN) backside thin film (not shown). In some embodiments, reflective multilayer 120 is a multilayer stack of molybdenum/silicon (Mo/Si) bi-layer having a total stack thickness of about 280 nm. A thin ruthenium (Ru) buffer/cap layer (not shown) is disposed between absorber layer 130 and multilayer 120 to protect reflective multilayer 120. The thickness of the protective buffer layer is about 3.5 nm. In some embodiments, absorber layer 130 is tantalum boride nitride (TaBN) having a thickness of about 60 nm. In some embodiments hard mask top layer 140 is made of chromium (Cr) or chromium-containing compounds such as, for example, chromium nitride (CrN) or chromium oxynitride (CrON) having a thickness of about 6 nm. A person of ordinary skill in the art would appreciate that the layer thicknesses provided should not be considered limiting as these layer thicknesses may vary.

Figure 2:
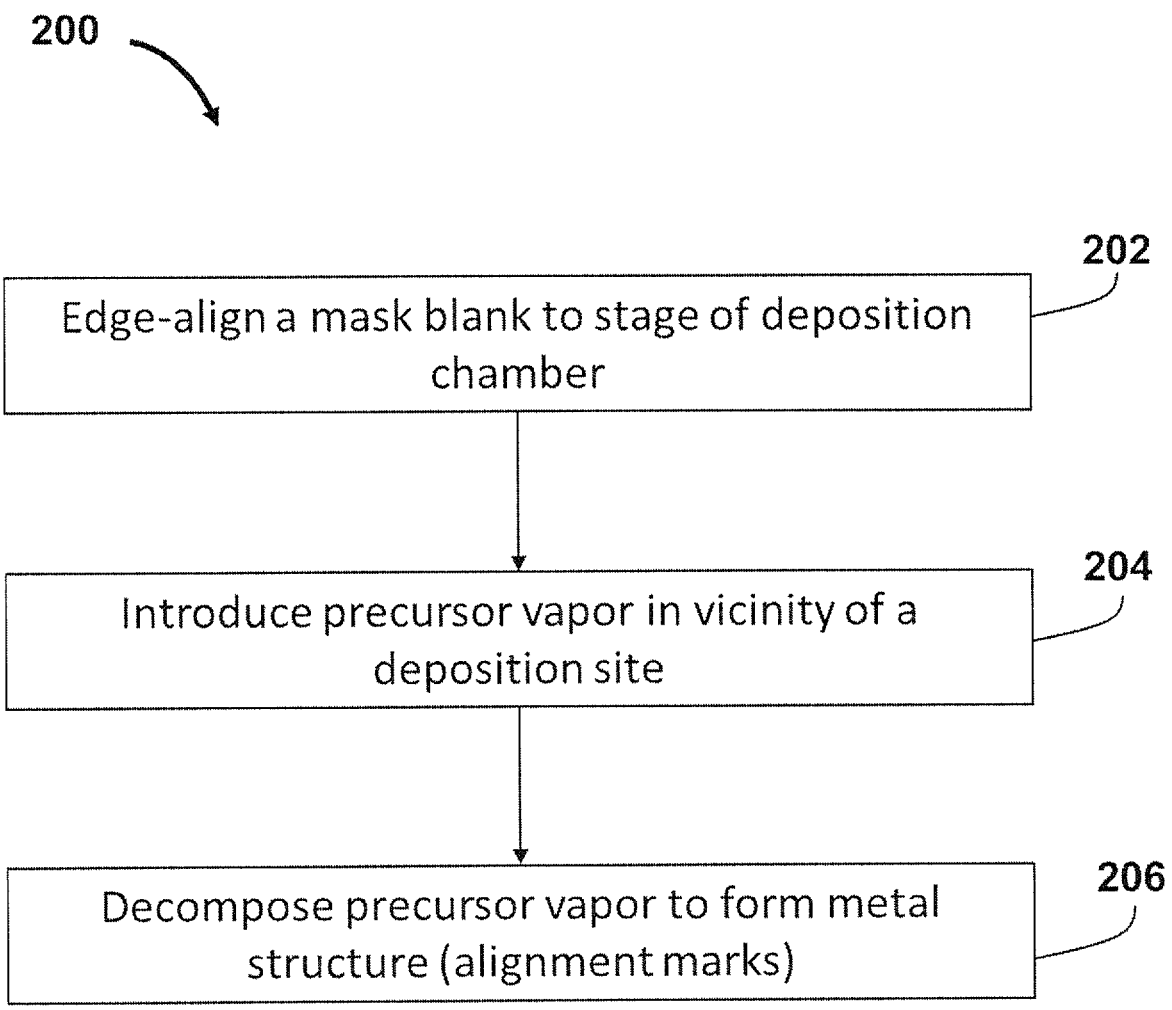
FIG. 2 is a flow diagram of a maskless method of making alignment marks on an extreme ultraviolet (EUV) mask blank, according to some embodiments.

FIG. 2 is a flow diagram of a maskless method 200 of making alignment marks on an extreme ultraviolet (EUV) mask blank, according to some embodiments. In some embodiments, maskless method 200 is a non-photolithographic alignment mark method 200. Method 200 does not require a mask and resist to create the alignment marks on the EUV mask blank. Hence method 200 is considered "maskless" and "resistless." Additional fabrication operations may be performed between the various operations of method 200, and are omitted merely for clarity. Maskless and resistless alignment mark fabrication processes in accordance with this disclosure are not limited to fabrication process 200.

By way of example and not limitation, method 200 can occur in a dual beam platform tool that has two columns: one column for e-beam generation and another column for ion beam generation. Alternatively, process 200 can occur in a scanning electron microscope (SEM) or a scanning transmission electron microscope (STEM).

E-beam induced deposition (EBID) of materials can be used to produce low-energy deposition that does not affect the underlying surface. This is contrary to ion-beam induced deposition (IBID), which is more energetic because ions are used instead of the smaller and lighter electrons. The spatial resolution (spatial accuracy) for the EBID process can be below 1 nm. The EBID process requires a high vacuum (e.g., $10^{-5}$ to $10^{-6}$ Torr) ambient to ensure that electron-matter collisions do not occur away from the reaction surface, and electrons do not lose a significant amount of kinetic energy before reaching the reaction surface.

Method 200 begins with operation 202 where an EUV mask blank (e.g., EUV mask blank 100 of FIG. 1) is edge-aligned to the stage of a deposition chamber. During the edge-alignment process, the edges of both the mask blank and the stage are aligned relative to each other. This alignment remains fixed for the remainder of the process.

In operation 204 the precursor vapor is introduced through a gas inlet on a top surface of the EUV mask blank (e.g., hard mask top layer 140 of FIG. 1) in the vicinity of a desired deposition site. The gas inlet is an orifice having a diameter that can be adjusted according to the precursor's vapor pressure so that a constant flow of precursor is provided during the deposition process. By way example and not limitation, the precursor can be hexacarbonylchromium ($Cr(CO)_6$) that is pre-heated to a vapor before it is introduced on the deposition site. Pre-heating produces sufficient vapor pressure for a consistent precursor flow throughout the deposition process. The precursor molecules are physically adsorbed on the mask blank's surface in the vicinity of the gas inlet but do not decompose at this stage. Physical adsorption ensures that the precursor molecules are not chemically interacting with the substrate and decompose.

In operation 206, an e-beam interacts with the physically adsorbed precursor molecules and decomposes them to form Cr metal structures (alignment marks). The e-beam energy can have a range between 10 and 300 keV; however this energy range can be high for precursor dissociation. Hence, a majority of the decomposition occurs through low energy electron interaction with the physically absorbed molecules. For example, with secondary electrons or backscattered (inelastically scattered) electrons. As a result, the metal structures (alignment marks) can have a larger lateral size than the e-beam spot size, which can be as small as 0.045 nm. This phenomenon is known as the "proximity effect" and is attributed to the secondary, backscattered, and forward scattered (if the beam dwells on already deposited material) electrons that contribute to the deposition and are not as tightly confined as the electrons of the incoming e-beam. Depending on the e-beam's energy, these electrons can leave the substrate up to several microns away from the point of impact of the electron beam, and therefore material deposition is not necessarily confined to the irradiated spot. To overcome this problem, compensation algorithms can be applied.

As the e-beam scans on the EUV mask blank's surface, Cr metal is deposited when the e-beam's path and the hexacarbonylchromium physically adsorbed molecules cross and interact with each other. Hence, Cr metal deposition can selectively occur on sites where the e-beam interacts with the physically adsorbed hexacarbonylchromium molecules.

Repeated physical adsorption and decomposition of the precursor molecules result in a buildup of Cr material in the e-beam scanned region. The deposition rate depends on a variety of processing parameters such as, for example, a partial pressure of the precursor, substrate temperature, electron beam parameters, and applied current density. The deposition rate can be in the order of 10 nm/s.

Additionally, by controlling the movement of the e-beam, any shape of Cr metal structures, or metal alignment marks, may be produced. The scanning can be computer controlled for added precision. Some of the parameters in this process are the e-beam size, e-beam current, and precursor vapor flow and partial pressure. A person of ordinary skill in the art will appreciate that other metals compatible with this deposition technique may be used to form the alignment marks.

In this exemplary embodiment, the metal alignment marks (metal structures) are formed over hard mask top layer 140 of EUV mask blank 100 and have a height of about 70 nm, while their footprint is nominally about 50 μm by 50 μm. Due to the large size of the alignment marks, the proximity effects attributed to the secondary, backscattered and forward scattered electrons are not a concern. The aforementioned dimensions are not intended to be limiting, and larger or smaller alignment marks are possible as long as proper defect registration is achieved during the mask blank inspection. In this context, proper defect registration is the successful identification of the defect's coordinates with respect to the alignment marks.

Figure 3:
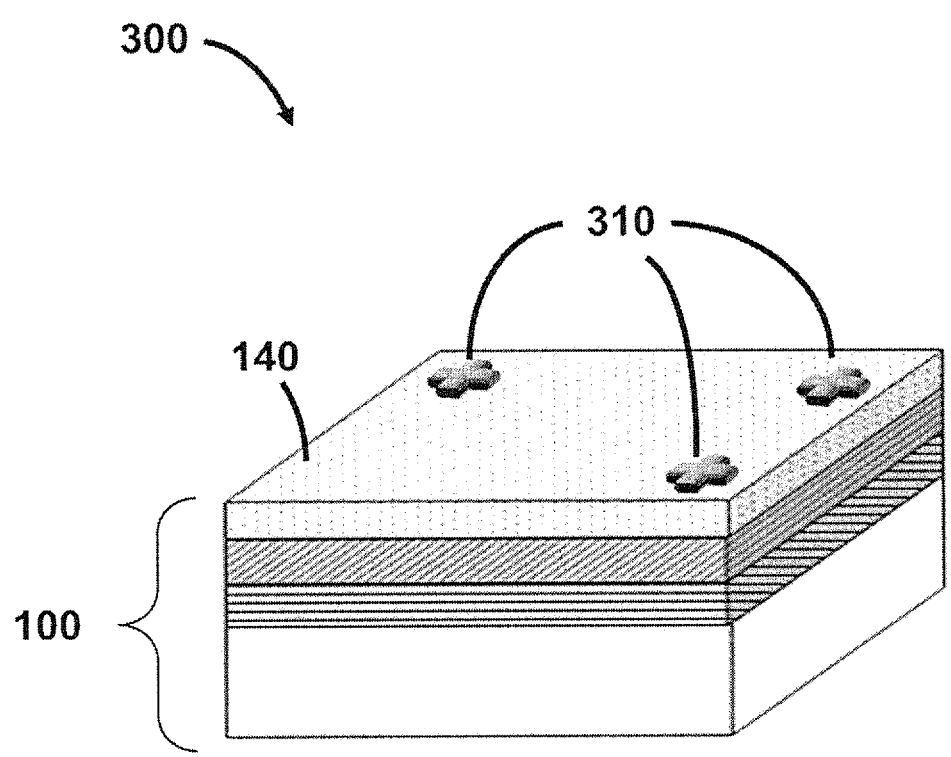
FIG. 3 is an isometric view of an extreme ultraviolet (EUV) mask blank with metal alignment marks, according to some embodiments.

FIG. 3 is an isometric view of EUV mask blank 300 with metal alignment marks 310 (metal structures), according to some embodiments. EUV mask blank 300 is similar to EUV mask blank 100 and has metal deposited alignment marks 310. In some embodiments, deposited alignment marks 310 are located over top layer 140 of EUV mask blank 100 instead of being etched in top layer 140. Alignment marks 310 can be formed using, for example, maskless and resistless fabrication process 200. In some embodiments, the number of alignment marks 310 is two or more (e.g., three alignment marks). In some embodiments, the dimensions of each alignment mark 310 is about 50 μm by 50 μm, where each alignment mark 310 has a height of about 70 nm. A person of ordinary skill in the art will appreciate that the number of alignment marks, their size, shape and position on the EUV mask blank may be different depending on the defect registration requirements during mask blank inspection.

Figure 4:
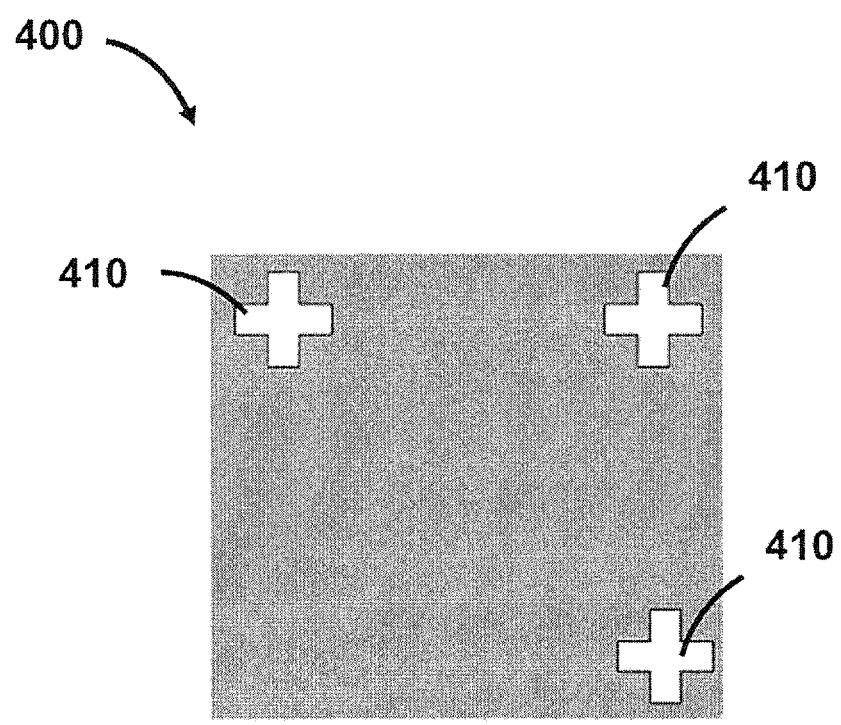
FIG. 4 is a top-down view of an etcher aperture, according to some embodiments.

FIG. 4 is a top-down view of an etcher aperture 400, according to some embodiments. Etcher aperture 400 includes openings 410 that extend through its entire thickness. Etcher aperture 400 is used as an etch mask, or shadow mask, during an etch process where a pattern of openings 410 is transferred via etching in the EUV blank's top layer 140 to form similar size and shape patterned structure (alignment marks). In some embodiments etcher aperture 400 can be made of quartz. However, other suitable materials compatible with the etch process can be used. In some embodiments, exemplary etcher aperture 400 has at least 3 openings 410 of a desired shape. In some embodiments, etcher aperture 400 has a thickness of about 2 mm. However, thicker or thinner etcher apertures can be used depending on the etching process parameters. In some embodiments, etcher aperture 400 has nominally the same dimensions as EUV mask blank 100. A person of ordinary skill in the art will appreciate that the number of openings 410, their shape, lateral dimensions, and position on etcher aperture 400 may be different depending on the defect registration requirements during mask blank inspection.

Figure 5:
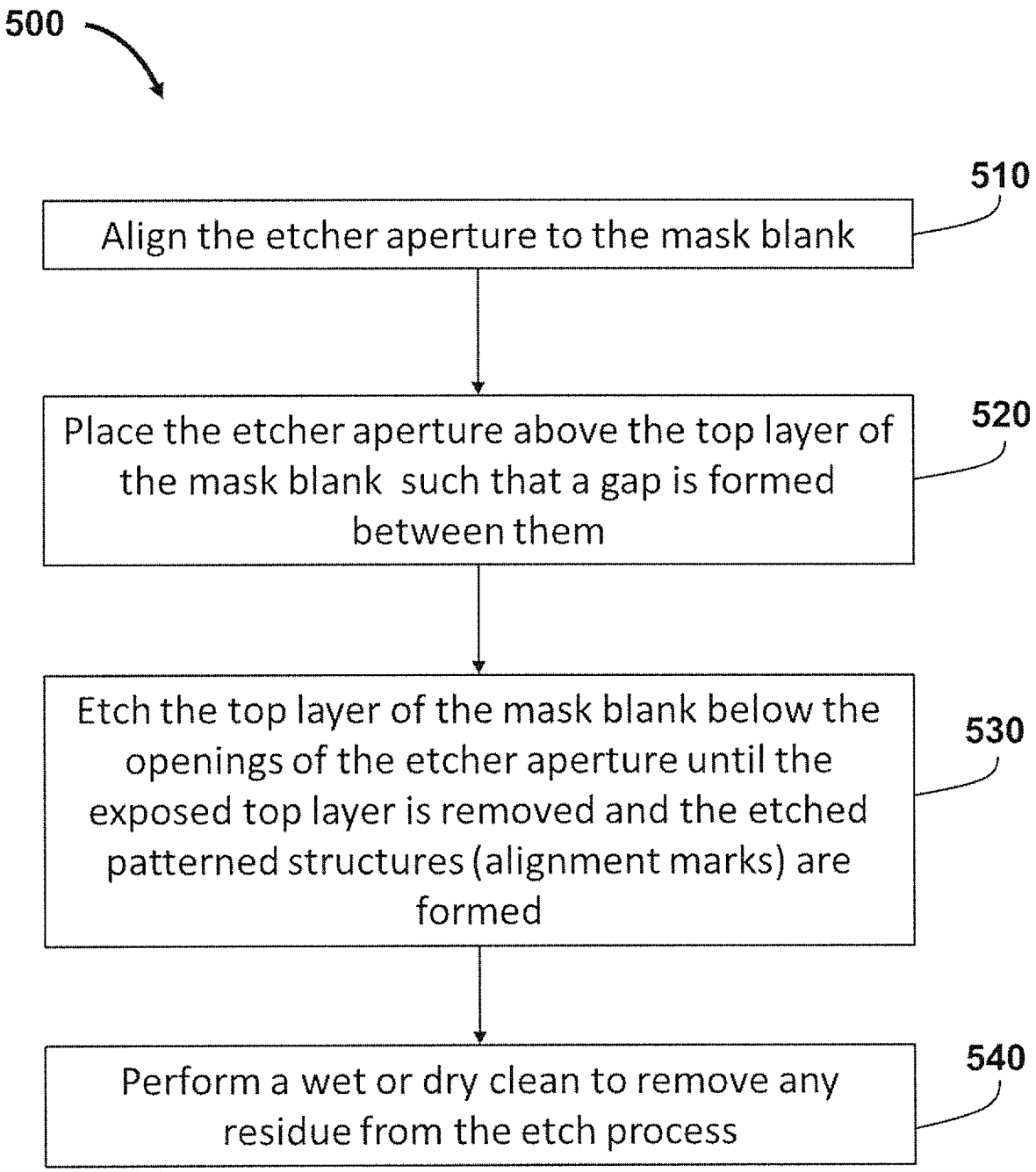
FIG. 5 is a flow diagram of a method of making alignment marks on an extreme ultraviolet (EUV) mask blank, according to some embodiments.

FIG. 5 is a flow diagram of a method 500 of making alignment marks on an EUV mask blank, according to some embodiments. Method 500 can be used to fabricate alignment marks using etcher aperture 400. In some embodiment, method 500 does not require a resist application to etch the pattern of the alignment marks in the top layer of the EUV mask blank. Hence method 500 is considered "resistless." Other fabrication operations may be performed between the various operations of method 500 and are omitted merely for clarity. The resistless fabrication process of alignment marks is not limited to exemplary method 500.

Method 500 starts with operation 510, in which etcher aperture 400 is aligned, or centered, on top of EUV mask blank 100. This operation secures the position of etcher aperture 400 in relation to EUV mask blank 100 so that the alignment marks are formed at desired predetermined locations in the top hard mask layer of EUV mask blank 100. The alignment, or centering process, can be performed, for example, in the etch chamber before the etch process begins.

Figure 6:
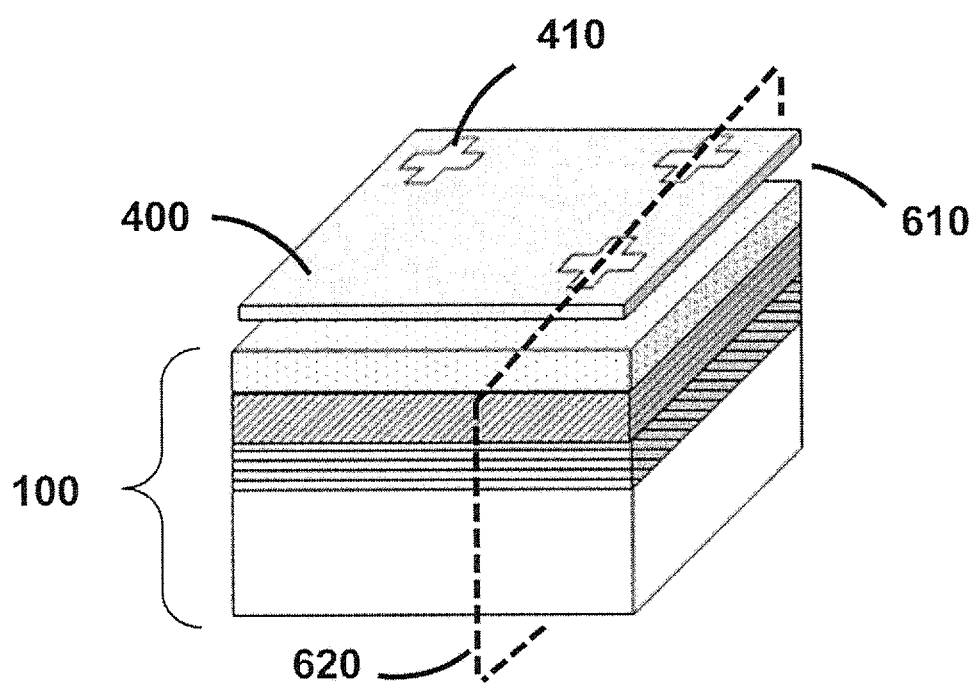
FIG. 6 is an isometric view of an etcher aperture above an extreme ultraviolet (EUV) mask blank, according to some embodiments.
Figure 7:
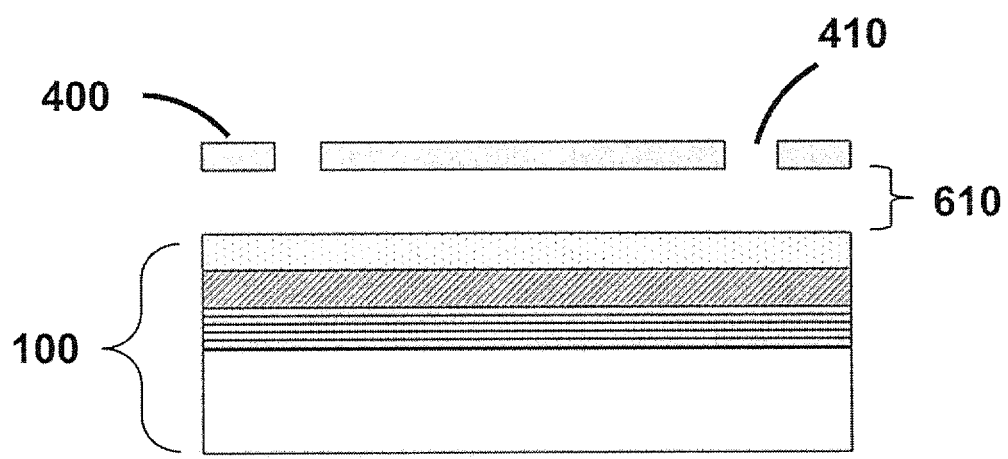
FIG. 7 is a cross sectional view of an etcher aperture above an extreme ultraviolet (EUV) mask blank in accordance with an alignment mark formation method of this disclosure, according to some embodiments.

In operation 520, etcher aperture 400 is placed above the top layer EUV mask blank 100 such that a gap is formed between them. FIG. 6 is an isometric view of etcher aperture 400 placed above EUV mask blank 100 with a gap 610 in between. FIG. 7 is a cross-sectional view along plane 620 of FIG. 6, and shows gap 610. Gap 610 between EUV mask blank 100 and etcher aperture 400 is an adjustable parameter that depends on the etch process conditions such as, for example, the gas chemistry, the mask blank temperature, and radio frequency (RF) of the plasma source. The relative position of etch aperture 400 and EUV mask blank 100 is fixed during the etch operation to avoid poor alignment mark definition. Poor alignment mark definition can create defect registration issues during mask blank inspection. By way of example and without limitation, the distance between etcher aperture 400 and EUV mask blank 100 can be nominally about 2 mm. During operation 520, an extensive undercut in top layer 140 will result in poorly shaped alignment marks which may lead to defect registration errors. Therefore, undercut in top layer 140 is not desirable unless it is controlled and uniform across the alignment marks.

In operation 530, a reactive ion etching (RIE) removes the areas of top layer 140 below openings 410 until the exposed top layer 140 is removed and the alignment marks are formed as etched patterned structures in top layer 140. In some embodiments, the RIE is sufficiently anisotropic to avoid extensive undercut. In some embodiments, the RIE is timed. In some embodiments, the RIE uses end-point detection (end-pointed), which means that the etch process is configured to automatically stop when the areas of top layer 140 below openings 410 have been sufficiently removed and portions of absorber layer 130 are exposed.

End point detection is possible because top layer 140 and absorber layer 130 are made of different materials. Consequently, these layers have different etch rates for a given etching chemistry. For example, top layer 140 can have a significantly higher etch rate than absorber layer 130 (e.g., greater than 2:1). Top layer 140 can be made of Cr or Cr-containing compounds such as, for example, CrN and CrON. On the other hand, absorber layer 130 can be TaBN. When top layer 140 is removed and absorber layer 130 is exposed, the etch rate abruptly drops. This drop in the etch rate is detected by in-situ metrology equipment such as, for example, an optical emission microscope. Since the optical emission microscope can be integrated into the etch chamber, real-time monitoring of the etch process is possible.

Depending on the thickness uniformity of top layer 140, the RIE may be either timed, end-pointed, or a combination of the two. By way of example and without limitation, the RIE can be timed during the beginning of the process, and end-pointed towards the end of the process. In some embodiments, the RIE chemistry is chlorine-based. A person of ordinary skill in the art will appreciate that other etching chemistries are possible, and the selection of the etch chemistry can be made based on the selectivity ratio between the material of top layer 140 and the material of the underlying absorber layer 130. During operation 530, in some embodiments, only the areas of top layer 140 that are directly exposed to plasma are removed such as, for example, the areas directly below openings 410.

The etch process is sufficiently anisotropic so that the etched alignment marks (patterned structures) in top layer 140 have similar or slightly larger size compared to openings 410 in etcher aperture 400. In some embodiments, anisotropic RIE ensures there is negligible, or no, undercut. Gap 610 between EUV mask blank 100 and aperture etcher 400, and the RIE process conditions will impact the anisotropy of the RIE process and the resulting shape/size of the formed patterned structures or alignment marks. A person of ordinary skill in the art will appreciate that the aforementioned parameters can be modified accordingly to ensure accurate alignment mark formation via an etch in top layer 140.

At this point patterned structures, the alignment marks, have been formed by etching portions of top layer 140. After the etch removal process has been completed, etcher aperture 400 is removed from the top of EUV mask blank 100. Alternatively, etcher aperture 400 remains in place and EUV mask blank 100 is removed from the etch chamber.

In operation 540, and depending on the integration scheme, an optional wet or dry clean process may be performed to remove any residue left behind from the etching process or to clean the surface from particles in preparation for the next operation.

Figure 8:
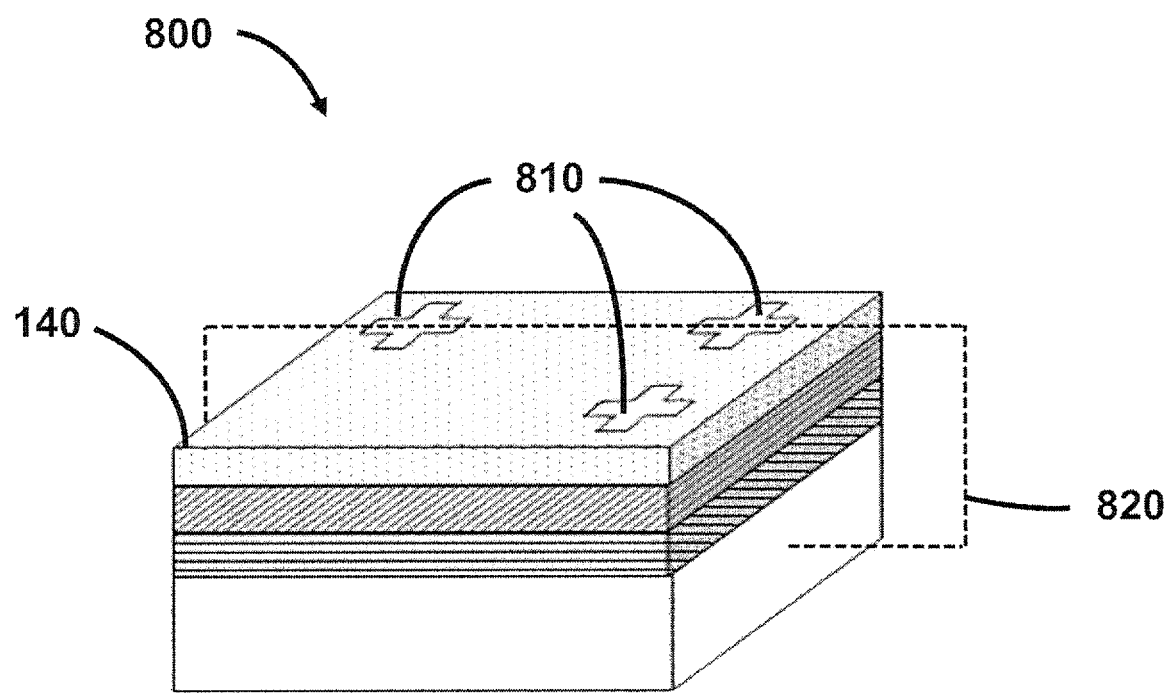
FIG. 8 is an isometric view of an extreme ultraviolet (EUV) mask blank with etched alignment marks, according to some embodiments.

FIG. 8 is an isometric view of EUV mask blank 800, similar to exemplary EUV mask blank 100, with etched patterned structure or alignment marks 810, according to some embodiments. Alignment marks 810 can be formed using exemplary resistless method 500. Alignment marks 810 appear as etched "trenches" in top layer 140, having a depth equal to the thickness of top layer 140. In some embodiments, the number of alignment marks 810 is at least three. In some embodiments, the dimensions of alignment marks 810 are about 50 μm by 50 μm (length×width). However this should not be considered a limitation, and smaller or larger alignment marks are possible. A person of ordinary skill in the art will appreciate that the number of alignment marks, their shape, dimensions and position on top layer 140 of the EUV mask blank may be different from the disclosure herein.

Figure 9:
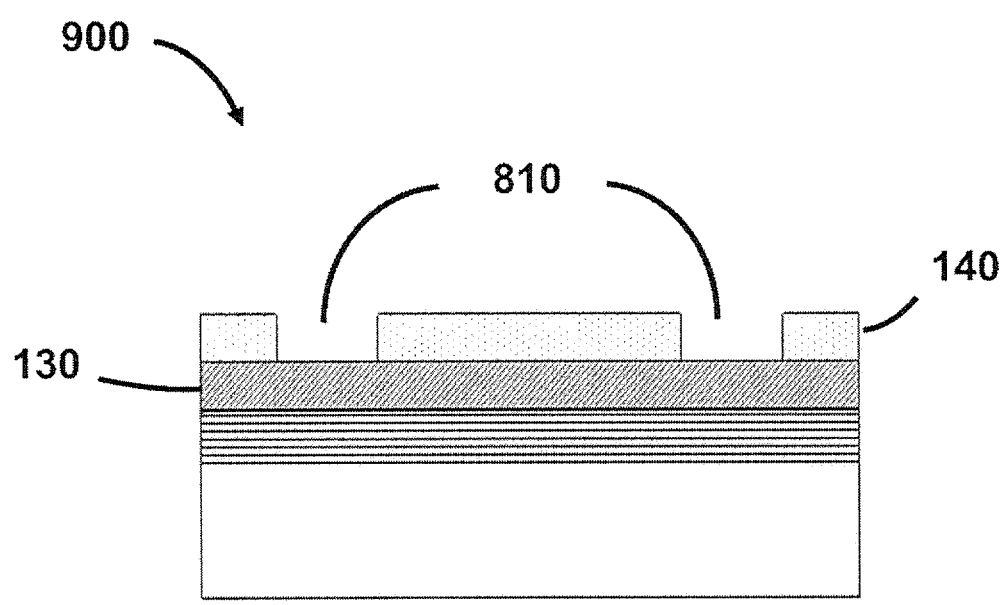
FIG. 9 is a cross sectional view of an extreme ultraviolet (EUV) mask blank with etched alignment marks, according to some embodiments.

FIG. 9 is a cross sectional view of EUV mask blank 900 taken along plane 820 of EUV mask blank 800 shown in FIG. 8. In this view, alignment marks 810 appear as openings in top layer 140. Because of the etch selectivity difference between top layer 140 and absorber layer 130, absorber layer 130 under alignment marks 810 is not recessed or otherwise damaged during the RIE process. If the selectivity between top layer 140 and absorber layer 130 is poor (e.g., less than 2:1), then alignment marks 810 would extend in absorber layer 130.

Alignment marks can be formed prior to a main pattern formation using similar fabrication methods to a pattern reproduction process on mask blanks. For example, alignment mark formation can require a combination of additional photolithography and etch operations. Due to this repetition of photolithographic and etching processes for alignment mark formation and main pattern transfer, the probability of defects increases due to the large number of processing steps involved. In addition, due to the repetition of the photolithographic and etching processes, manufacturing time increases as well.

Embodiments of this disclosure address these defect and time issues by providing maskless and/or resistless methods and device structures. The maskless and/or resistless process can include formation of the alignment marks through metal deposition (e.g., directly) on the top layer of an EUV mask blank to form metal structures, or formation of alignment marks with etching of the EUV mask blank's top layer through an etcher aperture to form patterned structures. The maskless and/or resistless process, among other things, simplifies the alignment mark formation and does not involve costly and time-consuming lithographic process steps. Lithographic process steps can be the source of defects. Several benefits of embodiments in accordance with this disclosure include simplified and fewer processing steps, mitigation of particle generation during processing, and overall manufacturing cost reduction through tool throughput improvements. And by facilitating the detection and repair of mask or reticle defects, wafer defectivity is also beneficially reduced.

In one embodiment, a method includes an EUV mask blank that includes a substrate material, a reflective multilayer, an absorber layer, and a top layer. The EUV mask blank is edge-aligned to a stage in a deposition chamber. A metal structure is formed without a resist on the top layer of the EUV mask blank. The formation of the metal structure includes dispensing a hexacarbonylchromium vapor on the top layer of the EUV mask and exposing the hexacarbonylchromium vapor to an electron-beam. The hexacarbonylchromium vapor is decomposed to form the metal structure at an area which is proximate to where the hexacarbonylchromium vapors interact with the electron-beam.

In another embodiment, a method an EUV mask that includes a substrate material, a reflective multilayer disposed over the substrate material, an absorber layer disposed over the reflective multilayer, and a top layer disposed over the absorber layer. A patterned structure is formed without a resist in the top layer of the EUV mask blank. The formation of the patterned structure includes an etcher aperture with a plurality of openings, where the etcher aperture is aligned to the EUV mask blank. The etcher aperture is placed above the top layer of the EUV mask blank so that a gap is allowed between the etcher aperture and the top layer of the EUV mask blank. The top layer of the EUV mask blank is etched through the openings of the etcher aperture to form an etched patterned structure in the top layer of the EUV mask blank and expose part of the absorber layer. The patterned structure is formed in the top layer of the EUV mask blank, below the plurality of openings of the etcher aperture. A clean process removes a residue from the etching of the top layer.

In another embodiment, an apparatus includes a reflective multilayer disposed over a substrate material, an absorber layer disposed over the reflective multilayer, a top layer disposed over the absorber layer, and a plurality of alignments marks. Each of the alignments marks is formed on or in the top layer of the EUV mask blank.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that a person of ordinary skill in the art may better understand the aspects of the present disclosure. A person of ordinary skill in the art will appreciate that they may readily use the present disclosure as a basis for designing or modifying other processes and structures for carrying out the same purposes and/or achieving the same advantages of the embodiments introduced herein. A person of ordinary skill in the art will also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing an extreme ultraviolet (EUV) mask blank comprising a substrate material, a reflective multilayer disposed over the substrate material, an absorber layer disposed over the reflective multilayer, and a top layer disposed over the absorber layer; and
   forming, without a resist, a patterned structure in the top layer of the EUV mask blank, wherein the forming comprises:
     providing an etcher aperture with a plurality of openings;
     aligning the etcher aperture to the EUV mask blank;
     placing the etcher aperture above the top layer of the EUV mask blank leaving a gap between the etcher aperture and the top layer of the EUV mask blank;
     etching the top layer of the EUV mask blank through the plurality of openings to form an etched patterned structure in the top layer of the EUV mask blank and expose part of the absorber layer, wherein the etched patterned structure is formed in the top layer of the EUV mask blank below the plurality of openings in the etcher aperture; and
     performing a clean process to remove a residue from the etching the top layer.

2. The method of claim 1, wherein the gap between the etcher aperture and the top layer of the EUV mask blank is nominally 2 mm.

3. The method of claim 1, wherein the etching the top layer of the EUV mask blank comprises etching the top layer of the EUV mask blank using a reactive ion etching (RIE) process.

4. The method of claim 3, wherein the RIE process comprises at least one of a timed etch or an end pointed etch.

5. The method of claim 3, wherein the RIE process comprises a substantially anisotropic process to minimize an undercut in the top layer of the EUV mask blank.

6. The method of claim 3, wherein the RIE process comprises a chlorine-based chemistry.

7. The method of claim 3, wherein the RIE process is substantially selective to the top layer of the EUV mask blank.

8. The method of claim 1, wherein the top layer of the EUV mask blank comprises chromium (Cr) or chromium-containing compounds and has a nominal thickness of 6 nm.

9. The method of claim 8, wherein the absorber layer comprises tantalum boride nitride (TaBN).

10. The method of claim 1, wherein the absorber layer comprises tantalum boride nitride (TaBN).

11. The method of claim 1, wherein the etcher aperture comprises quartz.

12. The method of claim 1, wherein the reflective multilayer comprises a first layer comprising molybdenum and a second layer comprising silicon.

13. The method of claim 1, wherein the EUV mask blank comprises a ruthenium cap layer disposed between the reflective multilayer and the absorber layer.

14. The method of claim 1, comprising:
   monitoring, during the etching, an etch rate of the EUV mask blank; and
   stopping the etching of the top layer of the EUV mask blank when a change in the etch rate exceeds a threshold.

15. The method of claim 14, wherein the monitoring comprises monitoring the etch rate using an optical emission microscope.

16. A method comprising:
   providing an extreme ultraviolet (EUV) mask blank comprising an absorber layer and a top layer disposed over the absorber layer; and
   forming, without a resist, a patterned structure in the top layer of the EUV mask blank, wherein the forming comprises:

placing an etcher aperture having a plurality of openings above the top layer of the EUV mask blank leaving a gap between the etcher aperture and the top layer of the EUV mask blank;

etching the EUV mask blank through the plurality of openings to form an etched patterned structure in the top layer of the EUV mask blank, wherein the etched patterned structure is formed in the top layer of the EUV mask blank below the plurality of openings in the etcher aperture;

monitoring, during the etching, an etch rate of the EUV mask blank; and stopping the etching of the EUV mask blank when a change in the etch rate exceeds a threshold.

17. The method of claim 16, wherein the monitoring comprises monitoring the etch rate using an optical emission microscope.

18. The method of claim 16, wherein:
the top layer of the EUV mask blank comprises chromium (Cr) or chromium-containing compounds, and
the absorber layer comprises tantalum boride nitride (TaBN).

19. The method of claim 16, wherein the etching comprises substantially anisotropically etching the EUV mask blank using a reactive ion etching (RIE) process.

20. A method comprising:
providing an extreme ultraviolet (EUV) mask blank comprising a substrate material, a reflective multilayer disposed over the substrate material, an absorber layer disposed over the reflective multilayer, and a top layer disposed over the absorber layer; and forming, without a resist, a patterned structure in the top layer of the EUV mask blank, wherein the forming comprises:
placing a etcher aperture having a plurality of openings above the top layer of the EUV mask blank leaving a gap between the etcher aperture and the top layer of the EUV mask blank; and etching the top layer of the EUV mask blank through the plurality of openings to form an etched patterned structure in the top layer of the EUV mask blank, wherein the etched patterned structure is formed in the top layer of the EUV mask blank below the plurality of openings in the etcher aperture.

* * * * *